United States Patent
Hatano et al.

(10) Patent No.: US 12,031,929 B2
(45) Date of Patent: Jul. 9, 2024

(54) PHYSICAL STATE MEASUREMENT DEVICE

(71) Applicant: TOKYO INSTITUTE OF TECHNOLOGY, Tokyo (JP)

(72) Inventors: Yuji Hatano, Tokyo (JP); Takayuki Iwasaki, Tokyo (JP); Mutsuko Hatano, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 105 days.

(21) Appl. No.: 17/915,987

(22) PCT Filed: Mar. 17, 2021

(86) PCT No.: PCT/JP2021/010756
§ 371 (c)(1),
(2) Date: Sep. 29, 2022

(87) PCT Pub. No.: WO2021/200144
PCT Pub. Date: Oct. 7, 2021

(65) Prior Publication Data
US 2023/0152258 A1  May 18, 2023

(30) Foreign Application Priority Data

Mar. 31, 2020 (JP) ................. 2020-064574

(51) Int. Cl.
*G01N 24/10* (2006.01)
*G01N 24/00* (2006.01)

(52) U.S. Cl.
CPC ........... *G01N 24/10* (2013.01); *G01N 24/006* (2013.01)

(58) Field of Classification Search
CPC .... G01N 24/10; G01N 24/006; G01R 33/007; G01R 33/032; G01R 33/26
See application file for complete search history.

(56) References Cited

U.S. PATENT DOCUMENTS

2018/0136291 A1  5/2018  Pham et al.

FOREIGN PATENT DOCUMENTS

| JP | 2017-162910 A | 9/2017 |
| JP | 2020-063960 A | 4/2020 |

(Continued)

OTHER PUBLICATIONS

International Search Report (ISR) (PCT Form PCT/ISA/210), in PCT/JP2021/010756, dated Jun. 8, 2021.

*Primary Examiner* — G. M. A Hyder
(74) *Attorney, Agent, or Firm* — MCGINN I.P. LAW GROUP, PLLC

(57) ABSTRACT

A physical state measurement apparatus includes a main solid material which generates fluorescence by excitation light from a light source part. A microwave application part applies microwaves to the main solid material so as to control an electron state of the main solid material. A detection part detects the physical state of an object to be measured by the fluorescence from the main solid material. A feedback part has a solid material for feedback and a control part and detects a difference in amplitude between operating points on a low-frequency side and a high-frequency side of a lowering portion of a spectrum amplitude centered on a resonance frequency of an electron spin resonance spectrum of fluorescence from the solid material for feedback and feedback-controls the microwave application part such that the difference becomes zero.

21 Claims, 8 Drawing Sheets

(56) References Cited

FOREIGN PATENT DOCUMENTS

| WO | WO 2018/155504 A1 | 8/2018 | | |
|----|-------------------|--------|--|--|
| WO | WO 2020/047006 A1 | 3/2020 | | |
| WO | WO 2020-080362 A1 | 4/2020 | | |
| WO | WO-2020080362 A1 * | 4/2020 | ......... | G01N 21/6408 |

* cited by examiner

← 74 μm →

PHYSICAL STATE MEASUREMENT DEVICE

TECHNICAL FIELD

The present invention relates to a physical state measurement apparatus using magnetic resonance, and more particularly to a physical state measurement apparatus capable of removing influence of variation in resonance frequency due to disturbance noise.

BACKGROUND ART

There is known a diamond sensor using a nitrogen-vacancy center (NV center) in the diamond crystal. The NV center, whose spin state can be detected at room temperature, is expected to be applied to a magnetic sensor or physical state measurement. The NV center exhibits strongly reddish fluorescence by excitation of green laser light. The fluorescence intensity at this time reflects the spin state, so that accurate detection of the fluorescence intensity of the NV center enables measurement of a physical state.

Further, there is known an apparatus that measures the magnetism of a biological sample such as cells by using two resonance frequencies on the electronic spin resonance spectrum of optically detected magnetic resonance (ODMR) of the NV center of a diamond sensor. Specifically the spectrum of fluorescence generated by excitation of the excitation light of the NV center has two peaks (lowering portions) of resonance frequency Zeeman-split by application of a static magnetic field. It is known that the interval between the two peaks increases/decreases depending on a magnetic field. Thus, the measurement of a change in the positions of the two peaks makes the measurement of magnetism possible.

Further, in the thus described magnetic measurement apparatus using magnetism resonance, in addition to the increase/decrease in the interval between the Zeeman-split two lowering portions of resonance frequency caused depending on a magnetic field, it is also known that the two lowering portions are parallelly moved depending on temperature. As a technology that can measure a magnetic image free from the influence of the temperature-dependent parallel movement, there is proposed a magnetic measurement apparatus (Patent Document 1), which is currently filed for patent application by the present inventor and applicant. In this technology the intensity of fluorescence at the NV center in the visual field of the diamond sensor is detected for each of two-dimensionally arrayed pixels of, e.g., a CMOS area sensor and is captured as an image. Image capturing is performed at frequencies of two maximum inclination points on the low and high frequency sides of the lowering portions of the respective two resonance frequencies, and thus four fluorescence images are obtained at frequencies of four maximum inclination points. At this time, feedback control is performed so as to keep constant the fluorescence intensity in the visual field of the image sensor from the initial state. As a result, it is possible to follow the variation in the positions of the two resonance frequencies and to remove the influence of the variation in the excitation light intensity. Further, by repeated exposure of the fluorescence image at frequencies of the four maximum inclination points, it is possible to remove external magnetic noise or temperature noise with a frequency lower than the repetition frequency.

CITATION LIST

Patent Document

Patent Document 1: Japanese Patent Application No. 2018-195324

DISCLOSURE OF THE INVENTION

Problems to be Solved by the Invention

In the conventional magnetic measurement apparatus, it is necessary to set the thickness of the NV center area of the diamond sensor to that corresponding to a resolution level for enhancing the resolution of the image. However, when the thickness of the NV center is small, the fluorescence intensity is lowered, so that it is necessary to increase exposure time in order to obtain the amount of light necessary for image capturing. In the apparatus of Patent Document 1, the resonance frequency of four operating points varies with variation in an environmental magnetic field, so that an increase in exposure time disadvantageously allows disturbance noise within exposure time at the four operating points to be detected as it is. Further, an image having a movement is difficult to observe.

The present invention has been made in view of the above situation, and an object thereof is to provide a physical state measurement apparatus capable of removing the influence of disturbance noise and thus stably measuring a physical state.

Means for Solving the Problems

To attain the above object, a physical state measurement apparatus according to the present invention may include: a light source part emitting excitation light; a main solid material disposed near an object to be measured and having electrons excited by the excitation light from the light source part; a microwave application part applying microwaves to the main solid material so as to control a state of the electrons of the main solid material; a detection part detecting an excited state of the electrons based on excitation by the excitation light in the main solid material to detect a physical state of the object to be measured; a feedback part having a solid material for feedback and a control part, the solid material for feedback being disposed opposite to the main solid material, being made of the same material as the main solid material, having a crystal plane orientation corresponding to the main solid material, and having electrons excited by the excitation light from the light source part, the control part detecting a change in at least one of two operating points on a low-frequency side and a high-frequency side of a lowering portion of a spectrum amplitude centered on a resonance frequency of an electron spin resonance spectrum based on excitation of the electrons by the excitation light in the solid material for feedback generated by microwaves from the microwave application part and feedback-controlling the microwave application part such that the change becomes zero; and a static magnetic field application part applying a static magnetic field to the main solid material and the solid material for feedback so as to make the electronic spin resonance spectrum have at least two resonance frequencies.

The solid material for feedback in the feedback part may have electrons excited by excitation light emitted from the light source part and leaking through the main sold material.

The physical state measurement apparatus may further include a filter part that passes the excitation light leaking to the solid material for feedback through the main solid material and blocks fluorescence from the solid material for feedback to the main solid material generated upon excitation by the excitation light in the solid material for feedback.

The feedback part may have a dividing part that divides the excitation light from the light source part, and the solid material for feedback may have electrons excited by the excitation light from the dividing part.

The physical state measurement apparatus may further include: a first filter part that blocks excitation light leaking from the main solid material to the object to be measured and a second filter part that blocks excitation light leaking from the solid material for feedback to the object to be measured.

The feedback part may detect a difference in amplitude between two operating points on a low-frequency side and high-frequency side of a lowering portion of a spectrum amplitude centered on a resonance frequency of an electron spin resonance spectrum based on excitation of electrons by the excitation light in the solid material for feedback and feedback-control the microwave application part such that the difference becomes zero.

The feedback part may detect a difference between one of two operating points on a low-frequency side and high-frequency side of a lowering portion of a spectrum amplitude centered on a resonance frequency of an electron spin resonance spectrum based on excitation of electrons by the excitation light in the solid material for feedback and a predetermined reference and feedback-control the microwave application part such that the difference becomes zero.

The feedback part may perform correction processing for a measurement result after physical state measurement when a detected change in at least one operating point falls within a predetermined range, while it may perform feedback-control when the change exceeds a predetermined value.

The detection part may use fluorescence excited and generated in the main solid material to detect an excited state of electrons.

The feedback part may detect an electron spin resonance spectrum of intensity of fluorescence excited and generated in the solid material for feedback.

The detection part may have a photo diode or an image sensor.

The feedback part may use a photodiode to detect the electron spin resonance spectrum.

The detection part may use photocurrent excited and generated in the main solid material to detect an excited state of electrons.

The feedback part may detect the electron spin resonance spectrum of photocurrent excited and generated in the sold material for feedback.

The feedback part may use one of at least two resonance frequencies of the electron spin resonance spectrum in the solid material for feedback.

The feedback part may further feedback-control the static magnetic field application part.

The main solid material and the solid material for feedback may each have an impurity atom-vacancy center, and the solid material for feedback may be equal to or higher than the main solid material in terms of impurity atom-vacancy center density per unit volume, larger than the main solid material in terms of the thickness of a layer including the impurity atom-vacancy center, and larger than the main solid material in terms of the total amount of the impurity atom-vacancy centers.

The main solid material and the solid material for feedback may be disposed parallel in the crystal plane orientation to each other so that the orientations of all the impurity atom-vacancy axes that can exist are the same.

The main solid material and the solid material for feedback may each be made of either of diamond, silicon carbide, gallium nitride, or boron nitride, and the main solid material and the solid material for feedback may have the same crystal plane orientation.

The main solid material may be a superfine solid material made of either of diamond, silicon carbide, gallium nitride, or boron nitride, and the solid material for feedback may have a crystal plane orientation in four directions.

Advantageous Effects of the Invention

The physical state measurement apparatus according to the present invention has an advantage of removing the influence of disturbance noise and stably measuring the physical state.

BEST MODE FOR CARRYING OUT THE INVENTION

Figure 1:
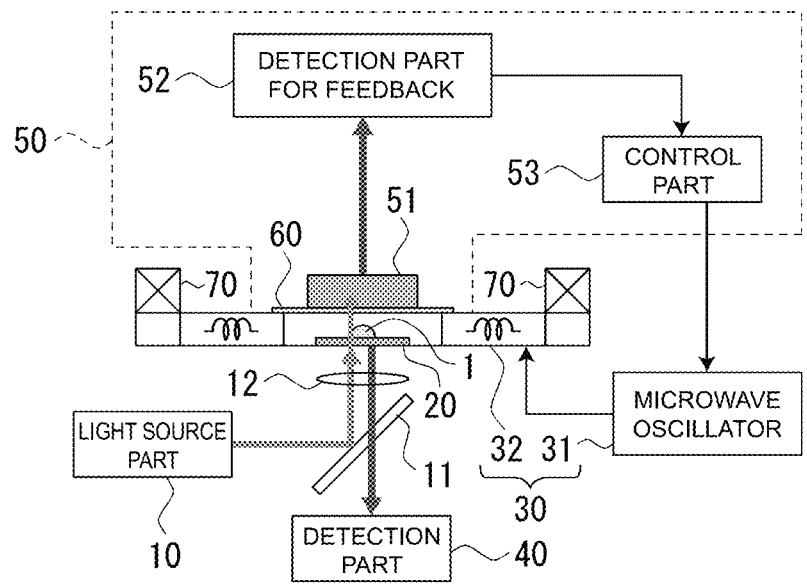
FIG. 1 is a schematic block diagram for explaining a physical state measurement apparatus according to the present invention.

Hereinafter, an embodiment for practicing the present invention will be described with reference to the illustrated examples. A physical state measurement apparatus according to the present invention is configured to detect a physical state of an object to be measured using magnetic resonance. The physical state mentioned here includes, for example, a magnetic field, an electric field, a temperature, and the like. Since the changes of a magnetic field, an electric field, a temperature, and the like influence magnetic resonance, it is applicable that it is possible to detect the physical state by detecting such changes. FIG. 1 is a schematic block diagram for explaining the physical state measurement apparatus according to the present invention. As illustrated, the physical state measurement apparatus according to the present invention mainly includes a light source part 10, a main solid material 20, a microwave application part 30, a detection part 40, a feedback part 50, and a static magnetic field application part 70.

The light source part 10 emits excitation light. The light source part 10 may be, for example, a laser light source, or an LED light source. The light source part 10 only needs to be configured to emit light of a wavelength that excites the main solid material 20 to be described later. For example, when the main solid material 20 is made of diamond, the light source part 10 only needs to be configured to emit green light of a wavelength of 533 nm. As illustrated, the excitation light from the light source part 10 may be irradiated onto the main solid material 20 using a dichroic mirror 11, an objective lens 12, and the like, in an appropriate manner.

The main solid material 20 has electrons excited by the excitation light from the light source part 10. The main solid material 20 is made of, for example, diamond. The main solid material 20 may be sheet-like diamond crystal. More specifically the main solid material 20 is a so-called diamond sensor having an NV center on the surface or in the vicinity of the surface of a diamond substrate. The NV center refers to a complex of nitrogen (N) atom replacing a carbon atom and a vacancy (V) adjacent to the nitrogen atom. In the main solid material 20, electrons captured by the NV center are excited by the excitation light. The main solid material 20 is disposed near an object 1 to be measured and is used to measure the physical state of the object 1 to be measured. When the main solid material 20 is excited by the excitation light, fluorescence is generated. Specifically when green light is emitted from the light source part 10, red fluorescence is generated. The detection part 40 to be described later may detect the excited state of the electrons using the electronic spin resonance spectrum of the fluorescence generated by the excitation of the electrons. The orientations of an NV axis of the main solid material 20 are arranged in a direction perpendicular to, for example, a (111) plane.

In the present specification, description will be mainly made assuming that the main solid material 20 is made of diamond; however, the present invention is not limited to this, and the main solid material may be made of, for example, silicon carbide, gallium nitride, boron nitride, or the like. The physical state measurement apparatus according to the present invention may use any material as the main solid material as long as it has an impurity atom-vacancy center and has electrons excited by excitation light.

The microwave application part 30 applies microwaves to the main solid material 20 so as to control the electron state of the main solid material 20. More specifically for example, the microwave application part 30 includes a microwave oscillator 31 and a coil substrate 32. The microwave oscillator 31 may be, for example, a voltage controlled oscillator capable of performing frequency modulation according to an input from the feedback part 50 to be described later. Further, as described later, the microwave oscillator 31 preferably has a list frequency sweep function. The coil substrate 32 has, for example, two coaxially arranged coils. On the coil substrate 32, the main solid material 20 is disposed between the two coils as illustrated, and a microwave magnetic field can be generated in a direction parallel to the surface of the main solid material 20. When the microwave magnetic field is made perpendicular to the NV axis of the main solid material 20, detection efficiency of a change in a magnetic field can be maximized.

The detection part 40 detects the physical state of the object 1 to be measured. The object 1 to be measured is disposed, for example, near the main solid material 20. As described above, the physical state may be one that influences electronic spin resonance spectrum, such as, a magnetic field, an electric field, a temperature, or the like. The detection of the physical state is performed by detecting the excited state of electrons based on the excitation by the excitation light in the main solid material 20. That is, fluorescence generated when the main solid material 20 is excited is used to detect the excited state of electrons. The detection part 40 is, for example, a photodiode or an image sensor. In the case of the photodiode, fluorescence in the entire visual field thereof is received. In the case of the image sensor, fluorescence is captured as an image. Specifically, the detection part 40 is, for example, a CMOS area image sensor and detects the intensity of fluorescence excited and generated in the main solid material 20 for each of two-dimensionally arrayed pixels. The fluorescence generated upon excitation of the main solid material 20 by the excitation light is guided to the detection part 40 using the objective lens 12, dichroic mirror 11, and the like, in an appropriate manner. The detection part 40 is not limited to the photodiode or image sensor as long as it can detect the excited state of electrons using fluorescence generated upon excitation of the main solid material 20.

Further, in the physical state measurement apparatus according to the present invention, the detection part 40 is not limited to one that receives the fluorescence generated upon excitation of the main solid material 20. For example, the detection part 40 may be one that detects the excited state of electrons using photocurrent generated upon excitation of the main solid material 20.

The above-described light source part 10, main solid material 20, microwave application part 30, and detection part 40 are not limited to ones that have a specific configuration, and conventional or future-developed ones may all be applicable.

The following describes the feedback part 50 which is the most characteristic functional part in the physical state measurement apparatus according to the present invention. The feedback part 50 has a solid material 51 for feedback and a control part 53. The solid material 51 for feedback has electrons excited based on excitation light from the light source part 10. The feedback part 50 uses the solid material 51 for feedback that has electrons excited based on excitation light from the light source part 10 to feedback control the microwave application part 30. FIG. 1 illustrates an example in which the solid material 51 for feedback is excited by excitation light emitted from the light source part 10 and leaking through the main solid material 20. Specifically the feedback part 50 includes a solid material 51 for feedback, a detection part 52 for feedback, and a control part 53.

The solid material 51 for feedback is disposed opposite to the main solid material 20 across the object 1 to be measured. The solid material 51 for feedback is made of the same material as the main solid material 20. Further, the solid material 51 for feedback may have a crystal plane orientation corresponding to the main solid material. In this example, the solid material 51 for feedback has the same crystal plane orientation as the main solid material 20. The illustrated solid material 51 for feedback has electrons excited by excitation light emitted from the light source part 10 and leaking through the main solid material 20. That is, the excitation light irradiated to the main solid material 20 leaks upward in the drawing from the main solid material 20. The solid material 51 for feedback has an electron excited by this leaking light. For example, when the main solid material 20 is a diamond sensor having NV centers, the solid material 51 for feedback may also be made of diamond having NV centers. When being excited by excitation light, the solid material 51 for feedback generates fluorescence. Specifically when the solid material 51 for feedback is made of diamond, red fluorescence is generated.

A filter part 60 may be provided as needed so as to prevent the fluorescence generated from the solid material 51 for feedback from returning to the main solid material 20. As illustrated, for example, the filter part 60 may be provided between the main solid material 20 and the solid material 51 for feedback. The filter part 60 may be configured to allow excitation light leaking to the solid material 51 for feedback through the main solid material 20 to pass therethrough and to block florescence generated upon excitation of the solid material 51 for feedback by excitation light so as to prevent the fluorescence from traveling from the solid material 51 for feedback to the main solid material 20. For example, the filter part 60 may be a high-pass filter (band-pass filter) that can block red fluorescence.

As described above, the solid material 51 for feedback is made of the same material as the main solid material 20 and has the same crystal plane orientation as the main solid material 20; however, in order to increase the intensity of fluorescence excited by excitation light for achieving high sensitivity the solid material 51 for feedback is preferably configured as follows. That is, the solid material 51 for feedback is preferably equal to or higher than the main solid material 20 in terms of impurity atom-vacancy center density per unit volume, larger than the main solid material 20 in terms of the thickness of a layer including an impurity atom-vacancy center, and larger than the main solid material 20 in terms of the total amount of impurity atom-vacancy centers. Further, the crystal plane orientations of the main solid material 20 and solid material 51 for feedback are preferably disposed parallel to each other so that the orientations of all the impurity atom-vacancy axes that can exist are the same. The intensity of fluorescence obtained by the thus configured solid material 51 for feedback becomes significantly stronger than that obtained by the main solid material 20, which attaches importance to resolution.

The detection part 52 for feedback detects the intensity (electronic spin resonance spectrum) of fluorescence generated upon excitation of the solid material 51 for feedback by excitation light. For example, the detection part 52 for feedback may be a photodiode which is a photoelectric conversion element. When the detection part 52 for feedback is constituted by the photodiode, fluorescence in the entire visual field can be received.

The control part 53 uses the electronic spin resonance spectrum detected by the detection part 52 for feedback to appropriately control the microwave application part 30. That is, for example, the control part 53 can voltage-control the microwave application part 30. Details of the control part 53 will be described later.

In the illustrated example, the feedback part 50 uses the solid material 51 for feedback excited by excitation light leaking through the main solid material 20; however, the present invention is not limited to this. The following describes an example of a feedback part that divides excitation light from the light source part 10 for use.

Figure 2:
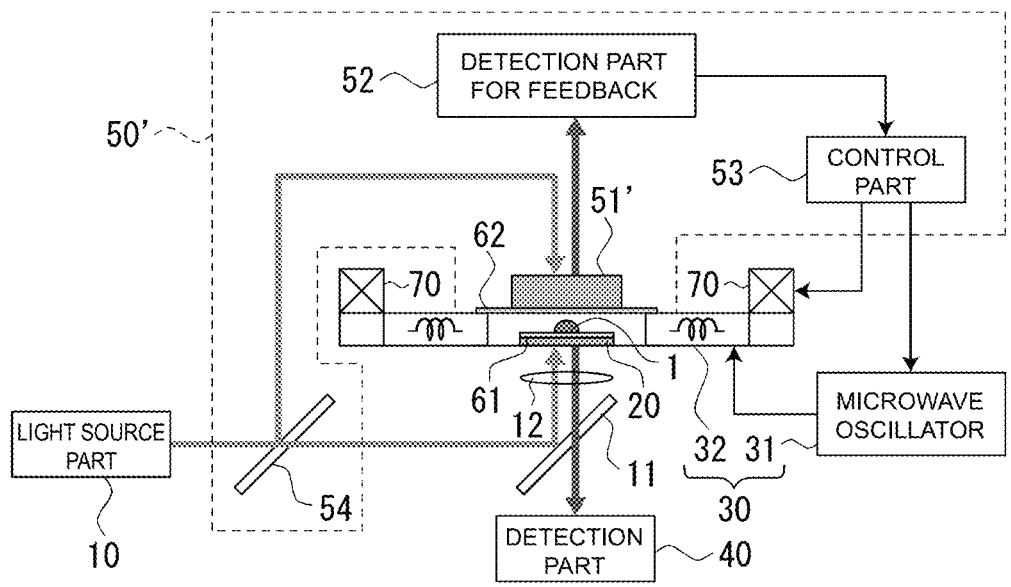
FIG. 2 is a schematic block diagram for explaining another example of the feedback part of the physical state measurement apparatus according to the present invention.

FIG. 2 is a schematic block diagram for explaining another example of the feedback part of the physical state measurement apparatus according to the present invention. In the drawing, the same reference numerals as those in FIG. 1 denote the same parts. As illustrated, a feedback part 50' of this example includes a dividing part 54, a solid material 51' for feedback, the detection part 52 for feedback, and the control part 53. The detection part 52 for feedback and the control part 53 are the same as those illustrated in FIG. 1, so the description thereof will be omitted.

The dividing part 54 divides excitation light from the light source part 10. The dividing part 54, which is, for example, a half mirror, is configured to divide the excitation light from the light source part 10 into excitation light directed to the main solid material 20 and excitation light directed to the solid material 51' for feedback.

The solid material 51' for feedback is made of the same material as the main solid material 20 and has a crystal plane orientation corresponding to the main solid material. Basically the solid material 51' for feedback may be the same as the solid material 51 for feedback illustrated in FIG. 1. That is, the solid material 51' for feedback has the same crystal plane orientation as the main solid material 20. In the illustrated example, the solid material 51' for feedback has electrons excited by excitation light from the dividing part 54. For example, when the main solid material 20 is a diamond sensor having NV centers, the solid material 51' for feedback may also be made of diamond having NV centers. The solid material 51' for feedback may generate fluorescence upon excitation by excitation light from the dividing part 54. The solid material 51' for feedback is disposed opposite to the main solid material 20 across the object 1 to be measured.

The feedback part 50' may have a first filter part 61 that blocks excitation light leaking from the main solid material 20 to the object 1 to be measured and a second filter part 62 that blocks excitation light leaking from the solid material 51' for feedback to the object 1 to be measured. For example, the first filter part 61 may be disposed between the object 1 to be measured and the main solid material 20 so as to prevent the object 1 to be measured from being broken due to irradiation of the excitation light thereto. The first filter part 61 may be constituted by a total reflection film made of a metal thin film. When the first filter part 61 is constituted by a dielectric filter or the like that can block only excitation light, the thickness of the first filter part 61 disposed between the object 1 to be measured and the main solid material 20 increases. This increases the distance between the main solid material 20 and the object 1 to be measured, with the result that resolution deteriorates. Therefore, the first filter part 61 is preferably constituted by a total reflection metal thin film. The second filter part 62 may be a notch filter disposed between the main solid material 20 and the solid material 51' for feedback and configured to block excitation light leaking from the solid material 51' for feedback to object to be measured. The luminance of fluorescence (red light) generated from the solid material 51' for feedback is an order of magnitude weaker than the excitation light irradiated to the solid material 51' for feedback. However, when even such weak fluorescence may cause unignorable damage to the object 1 to be measured disposed immediately above the first filter part 61, the second filter part 62 may be provided with a function of reducing the fluorescence, in addition to the notch filter function.

Then, the detection part 52 for feedback detects the intensity (electronic spin resonance spectrum) of fluorescence generated upon excitation by excitation light from the dividing part 54 of the solid material 51' for feedback.

When the dividing part 54 is used to irradiate the solid material 51' for feedback with excitation light as in the example illustrated in FIG. 2, it is possible to make the excitation light directed to the solid material for feedback stronger than in the example illustrated in FIG. 1. Accordingly the intensity of fluorescence generated upon excitation by such strong excitation light becomes stronger, thereby allowing more stable feedback control to be achieved.

Further, with a configuration in which fluorescence generated from the solid material 51' for feedback is divided by a half mirror or the like and received by an image sensor for bright-field observation which is a different image sensor from the detection part for feedback, it is possible to monitor in real time the bright-field image of the object 1 to be measured. In the example illustrated in FIG. 1, the bright-field image of the object 1 to be measured can be monitored by the detection part 40 through the main solid material 20. However, when, for example, a total reflection metal thin film is used as the first filter part 61 so as to prevent the object 1 to be measured from being broken as in the example illustrated in FIG. 2, the bright-field image of the object 1 to be measured cannot be monitored by the detection part 40. Thus, the bright-field image of the object 1 to be measured is monitored in real time by obtaining the bright-field image through the second filter part 62 by using fluorescence generated from the solid material 51' for feedback.

The following describes feedback control using electronic spin resonance spectrum, which is performed in the feedback part. The feedback part configured as illustrated in FIG. 1 or FIG. 2 uses electronic spin resonance spectrum based on excitation of electrons by the excitation light in the solid material for feedback generated by microwaves from the microwave application part 30 to thereby feedback-control the microwave application part 30. The feedback control includes detecting a change in at least one of two operating points on the low-frequency side and high-frequency side of a lowering portion of a spectrum amplitude centered on the resonance frequency of the electronic spin resonance spectrum based on excitation of electrons by the excitation light in the solid material for feedback and feedback-controlling the microwave application part such that the change becomes zero. Specifically, for example, a difference between amplitudes of the two operating points on the low-frequency side and high-frequency side of a lowering portion of a spectrum amplitude centered on the resonance frequency of the electronic spin resonance spectrum is detected, and feedback control is performed such that the detected difference becomes zero. It is known that fluorescence intensity is lowered at the resonance frequency at which magnetic resonance of the electronic spin resonance spectrum occurs, and the peak (valley) of the fluorescence intensity is the lowering portion. For example, when the solid material 51 (51') for feedback is made of diamond, the lowering portion of the spectrum amplitude appears around 2870 MHz which is the resonance frequency in the absence of a static magnetic field (external magnetic field).

The static magnetic field application part 70 applies a static magnetic field to the main solid material 20 and solid material 51 (51') for feedback so as to make the electronic spin resonance spectrum have at least two resonance frequencies. When the static magnetic field application part 70 is used to apply a static magnetic field to the main solid material 20 and solid material 51 (51') for feedback, the electronic spin resonance spectrum is Zeeman-split to have two resonance frequencies. For example, when the solid material 51 (51') for feedback is made of diamond, two lowering portions of the spectrum amplitude symmetrically centered around 2870 MHz appear. It is known that the interval between the two resonance frequencies increases/decreases depending on a magnetic field and that the two resonance frequencies are parallelly moved depending on temperature. Utilizing these phenomena, the detection part 40 can measure a magnetic image of the object 1 to be measured.

Figure 3:
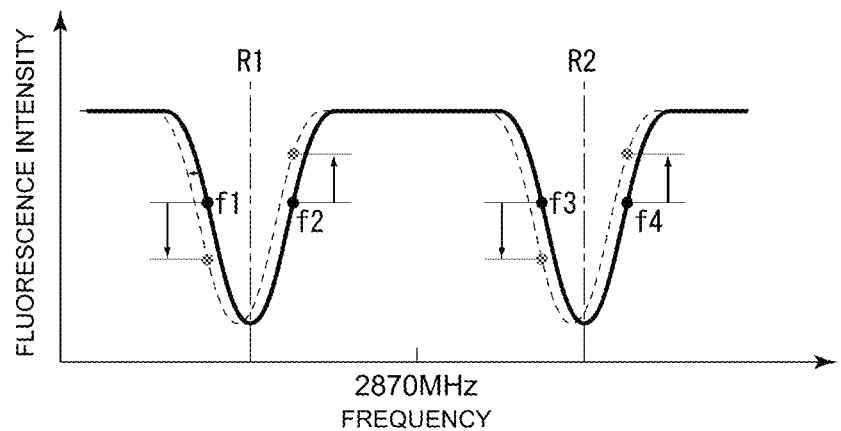
FIG. 3 is a conceptual view of electronic spin resonance spectrum obtained by a solid material for feedback of a feedback part of the physical state measurement apparatus according to the present invention.

Here, details of the electronic spin resonance spectrum will be described using FIG. 3. FIG. 3 is a conceptual view of the electronic spin resonance spectrum obtained by the solid material for feedback of the feedback part of the physical state measurement apparatus according to the present invention. The horizontal axis represents the frequency of microwaves applied by the microwave application part 30, and the vertical axis represents the relative intensity of fluorescence excited in the solid material 51 (51') for feedback. The electronic spin resonance spectrum illustrated in FIG. 3 has two resonance frequencies due to application of a static magnetic field. However, the present invention is not limited to this, and the electronic spin resonance spectrum may have four resonance frequencies.

As illustrated in FIG. 3, when the static magnetic field application part 70 applies a static magnetic field to the main solid material and the solid material for feedback, Zeeman-split two resonance frequencies R1 and R2 are obtained. For example, when the solid material 51 for feedback is made of diamond, two lowering portions of the spectrum amplitude symmetrically centered around 2870 MHz appear. The operating points on the low-frequency side and high-frequency side of the lowering portions of each of the two resonance frequencies R1 and R2 are assumed to be operating points f1 and f2, and f3 and f4, respectively. The operating point may be determined by obtaining, for example, the maximum inclination point of the spectrum amplitude. Specifically the operating point f1 of the resonance frequency R1 indicates a frequency at the negative maximum inclination point, and the operating point f2 indicates a frequency at the positive maximum inclination point. It is known that, in general, the maximum inclination point at which the inclination angle becomes steepest is located at 60% to 75% position of the depth of the lowering portion. Therefore, the operating points are not limited to the positive and negative maximum inclination points and may be set to positive and negative positions at which the fluorescence intensity at a specific percentage of the depth of the lowering portion is obtained.

To set the initial state, first the microwave application part is used to perform sweeping within a frequency range including the resonance frequencies R1 and R2. Then, the frequencies of the two lowering portions are identified. By adjusting the phase of the microwave oscillator, for example, to equalize the amplitudes of the lowering portions. Thereafter, the operating points on the low-frequency side and high-frequency side of each of the lowering portions are determined. A state where the amplitudes (heights) at the frequencies of the operating points at this time are equal to each other is stored as the initial state.

It is known that the resonance frequency drifts (translation of the entire lowering portion of the spectrum amplitude) due to disturbance noise such as a change in temperature or external magnetic field. For example, as denoted by the broken line in the drawing, it is assumed that the electronic spin resonance spectrum drifts to the low-frequency side due to disturbance noise. When the electronic spin resonance spectrum drifts in this way the amplitudes at the frequencies of the operating points f1 and f2 vary Specifically in the illustrated example, the amplitude of the operating point f1 lowers, while the amplitude of the operating point f2 rises. The difference in the height corresponds to disturbance noise. Therefore, a change in the difference in the amplitude from the initial state is detected, whereby the drift amount can be detected as the difference in the amplitude. Then, the difference between the amplitudes of the operating points f1 and f2 is detected, and the microwave application part 30 is feedback-controlled such that the detected difference becomes zero, whereby the resonance frequency can be made to follow the disturbance noise at all times, thus making it possible to remove the influence of the drift due to disturbance noise.

When the magnitude of the disturbance noise of a magnetic field is not large enough, when converted into microfrequency to fall outside the slope (more precisely the linear area of the slope) of the lowering portion of the electronic spin resonance spectrum, feedback control need not be performed. In this case, after measurement of the physical state, correction processing is applied to measurement results of, for example, temperature, whereby disturbance noise can be removed. That is, depending on the magnitude of disturbance noise, whether to perform feedback control or correction processing after physical state measurement can be selected. For example, when the difference between the amplitudes of the operating points f1 and f2 falls within a predetermined range, the correction processing is performed after physical state measurement, while when the difference between the amplitudes of the operating points f1 and f2 exceeds a predetermined value, feedback-control is performed.

In the physical state measurement apparatus according to the present invention, at least one of the two resonance frequencies (e.g., resonance frequency R1) may be used. Further, the resonance frequencies R1 and R2 may alternately be used, or the resonance frequency R2 may be used at a predetermined timing as needed.

Further, in the physical state measurement apparatus according to the present invention, the feedback part can feedback-control also the static magnetic field application part 70 based on the difference in the amplitude between the operating points. That is, the drift amount of the electronic spin resonance spectrum due to a change in, e.g., temperature or the like is feedback-controlled by the static magnetic field applied by the static magnetic field application part 70 such that the difference in the amplitude between the operating points becomes zero.

As described above, the physical state measurement apparatus according to the present invention uses, in addition to the main solid material, the solid material for feedback made of the same material as the main solid material and thus can perform feedback control using fluorescence obtained from the solid material for feedback. Thus, for example, it is possible to increase fluorescence intensity by increasing the thickness of a layer including an impurity atom-vacancy center without depending on the main solid material in which the thickness of a layer including an impurity atom-vacancy center needs to be set to that corresponding to a resolution level. In this case, the entire thickness of the solid material 51' for feedback may be a layer including a high-concentration impurity atom-vacancy center. This enables stable feedback control without depending on resolution. When impurity atom-vacancy center density is not uniform over the entire substrate of the solid material for feedback, the high side of the impurity atom-vacancy center density is preferably disposed on the side close to the main solid material side. This is for applying microwaves or static magnetic field as equally as possible to the majority of the impurity atom-vacancy centers in the main solid material and the majority of impurity atom-vacancy centers in the solid material for feedback.

In the physical state measurement apparatus according to the present invention, the feedback part is not limited to one that uses fluorescence generated upon excitation of the solid material for feedback. For example, the detection part for feedback may detect the electronic spin resonance spectrum of photocurrent generated upon excitation of the solid material for feedback.

Figure 4:
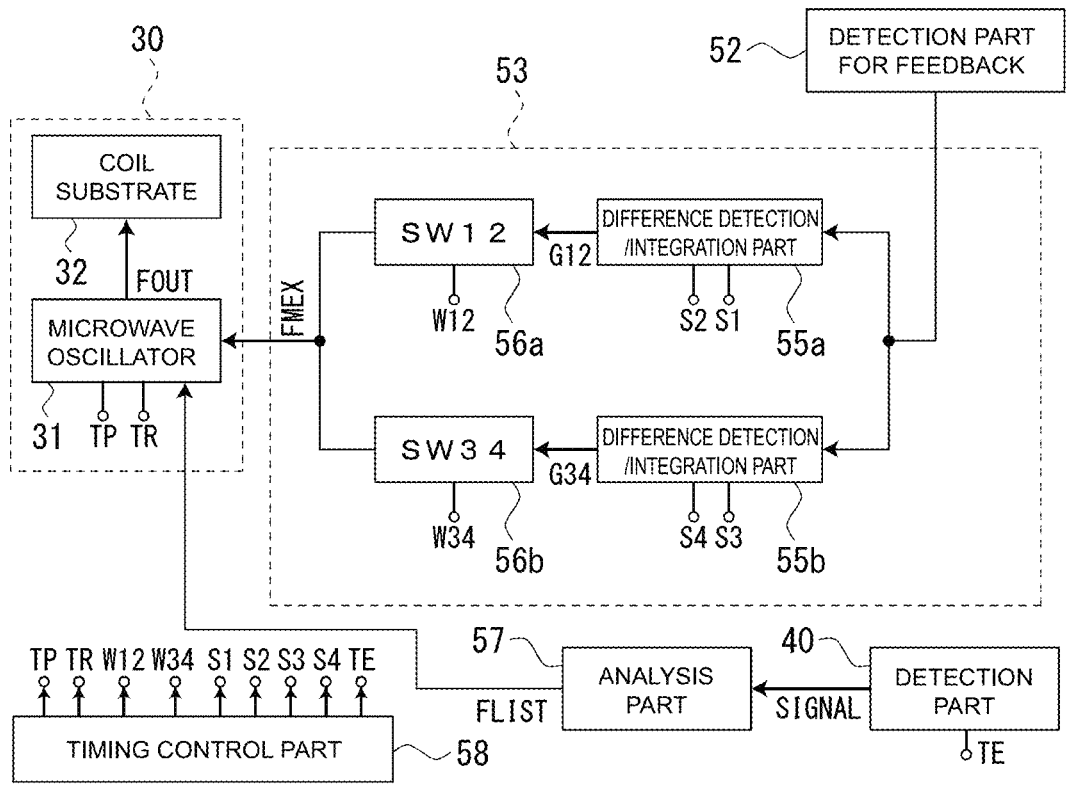
FIG. 4 is a schematic block diagram for explaining a specific example of the feedback part of the physical state measurement apparatus according to the present invention.

FIG. 4 is a schematic block diagram for explaining a specific example of the feedback part of the physical state measurement apparatus according to the present invention.

As illustrated, fluorescence detected by the detection part 52 for feedback is converted into voltage and is sent to the control part 53 in the form of a fluorescence signal. In the control part 53, the fluorescence signal is input to difference detection/integration parts 55a and 55b. The difference detection/integration part 55a detects the difference in amplitude at the frequencies of the operating points f1 and f2, and the difference detection/integration part 55b detects the difference in amplitude at the frequencies of the operating points f3 and f4.

Figure 5:
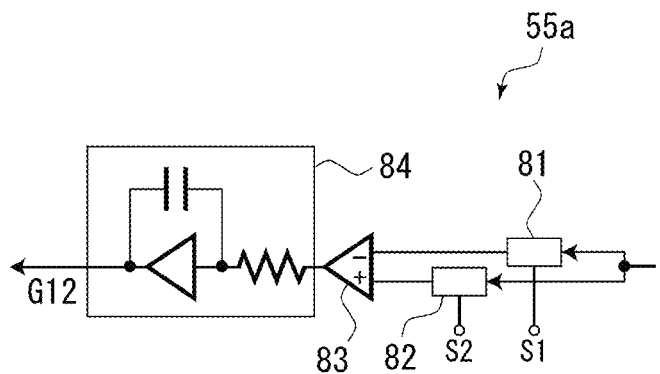
FIG. 5 is a schematic block diagram for explaining a specific example of a difference detection/integration part of the feedback part illustrated in FIG. 4 of the physical state measurement apparatus according to the present invention.

FIG. 5 is a schematic block diagram for explaining a specific example of the difference detection/integration part of the feedback part illustrated in FIG. 4 of the physical state measurement apparatus according to the present invention. The difference detection/integration parts 55a and 55b have basically the same configuration, so only the difference detection/integration part 55a is illustrated in FIG. 5. As illustrated, the difference detection/integration part 55a includes sample/hold circuits 81 and 82, a differential amplifier 83, and an integrator 84. The sample/hold circuits 81 and 82 sample and hold the amplitude of the operating point f1 and the amplitude of the operating point f2 at predetermined timings (S1, S2). The differential amplifier 83 inputs thereto the amplitudes, detects a difference therebetween, and outputs the detection result to the integrator 84. The integrator 84 outputs an output G12.

Referring back to FIG. 4, the microwave oscillator 31 of the microwave application part 30 may be configured to output, based on the difference input thereto from the difference detection/integration part 55a or 55b, a predetermined frequency signal FOUT controlled such that the input difference becomes zero. That is, the microwave oscillator 31 is controlled such that the output G12 from the difference detection/integration part 55a becomes zero. Similarly, the microwave oscillator 31 is controlled such that an output G34 from the difference detection/integration part 55b becomes zero. For example, the microwave oscillator 31 may have a list frequency sweep function and a frequency modulation function. The list frequency sweep function is a function of oscillating a signal of a frequency set in a frequency list FLIST previously designated by an analysis part 57 in synchronization with a sweep start signal TP and a frequency update signal TR which are designated by a timing control part 58. The frequency modulation function is a function of modulating the oscillated frequency based on a frequency modulation input FMEX (integrated value of a difference in a fluorescence signal). Switches (SW12, SW34) 56a and 56b are provided for selecting which one of the two resonance frequencies R1 and R2 for which the integrated value of the difference in the fluorescence signal of the operating point is calculated and output to the frequency modulation input FMEX. As described above, in the physical state measurement apparatus according to the present invention, only the resonance frequency R1 may be used, or the resonance frequencies R1 and R2 may alternately be used.

Here, details of operation including the detection part 40 will be described. The detection part 40 is, for example, an image sensor and can detect two-dimensional distribution of florescence intensity output from individual pixels every single exposure/readout as a fluorescence image signal SIGNAL. The fluorescence image signal is input to the analysis part 57. The analysis part 57 updates four operating point reference frequencies F10, F20, F30, and F40 such that fluorescence intensity average values of all the pixels in the effective visual field area at the four operating point reference frequencies F10, F20, F30, and F40 approach values corresponding to the operating points f1 to f4, respectively. However, in the main solid material 20, since the impurity atom-vacancy centers are made to be concentrated only on the surface (surface on the side on which the object 1 to be measured is placed) thereof so as to ensure spatial resolution, the total amount thereof is limited. Thus, the fluorescence intensity obtained in a single exposure is limited, and only when integration of the fluorescence image signals obtained through many times of exposures are repeated, the operating points can be effectively adjusted. An effective update frequency is, for example, once per several seconds.

Figure 6:
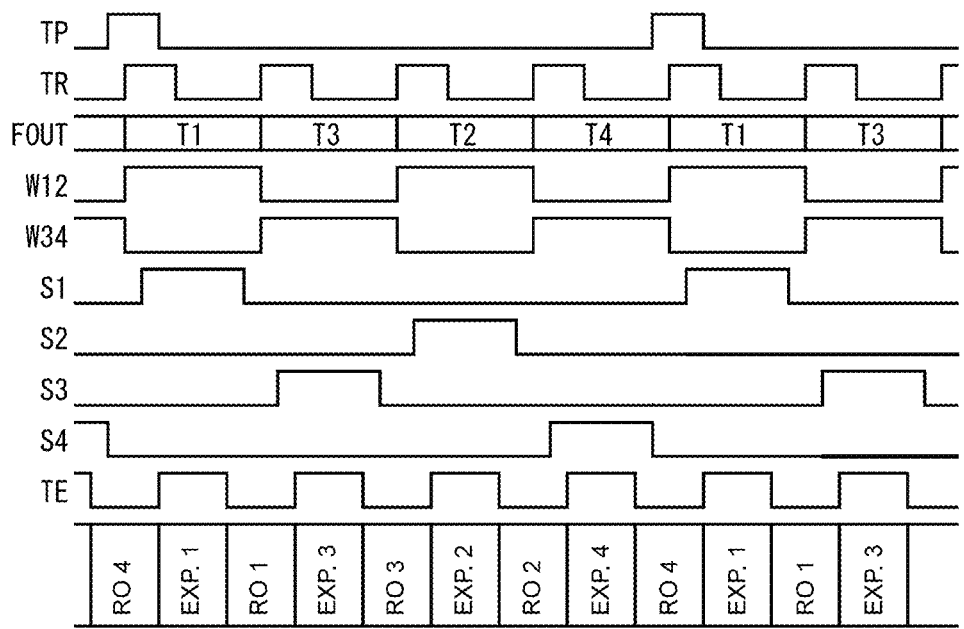
FIG. 6 is an operation timing chart of the feedback part illustrated in FIG. 4 of the physical state measurement apparatus according to the present invention.

FIG. 6 is an operation timing chart of the feedback part illustrated in FIG. 4. In this chart, S1 to S4 are operation timings of the sample/hold circuits 81 and 82 of each of the difference detection/integration parts 55a and 55b. W12 and W34 are on/off timings of the switches 56a and 56b, respectively. That is, in this example, the operating points f1 and f2 of the resonance frequency R1 and the operating points f3 and f4 of the resonance frequency R2 are alternately switched. TP is a sweep start signal, and TR is a frequency update signal. TE is an exposure timing in the detection part 40. That is, according to the timing TE, exposures 1 to 4 and readouts 1 to 4 of the detection part 40 are performed. As illustrated, for example, when all the operating points f1, f2, f3, and f4 are used, not a readout timing of S1-S2-S3-S4, but a readout timing of S1-S3-S2-S4 is preferable. That is, in the difference detection/integration part 55a, when a time from when S1 is turned ON to when S2 is turned ON next and a time from when S2 is turned ON to when S1 is turned ON next are the same, input balance to the differential amplifier 83 becomes better, and thus a variation in output of the integrator 84 becomes smaller.

In FIG. 6, depending on a combination of the sweep start signal TP and frequency update signal TR, the frequency of the output FOUT of the microwave oscillator 31 becomes as follows:

$F10+\alpha \cdot G12$ at timing $T1$ $F20+\alpha \cdot G12$ at timing $T2$ $F30+\alpha \cdot G34$ at timing $T3$ $F40+\alpha \cdot G34$ at timing $T4$ where $\alpha$ is a proportional constant. The timing S1 of the sample/hold circuit 81 is set within the timing T1 of the output FOUT. At the timing S1, a feedback path of microwave oscillator 31→coil substrate 32→solid material 51 for feedback→detection part 52 for feedback→difference detection/integration part 55a→switch 56a→microwave oscillator 31 is closed, and the difference detection/integration part 55a operates such that the difference in fluorescence intensity between the operating points f1 and f2 becomes zero. Similarly, also at the timing S2, the difference detection/integration part 55a operates such that the difference in fluorescence intensity between the operating points f1 and f2 becomes zero. At the timing S3, a feedback path of microwave oscillator 31→coil substrate 32→solid material 51 for feedback→detection part 52 for feedback→difference detection/integration part 55b→switch 56b→microwave oscillator 31 is closed, and the difference detection/integration part 55b operates such that the difference in fluorescence intensity between the operating points f3 and f4 becomes zero. Similarly, also at the timing S4, the difference detection/integration part 55b operates such that the difference in fluorescence intensity between the operating points f3 and f4 becomes zero.

In the detection part 40, exposure is performed at the timing TE within each of the timings S1 to S4. At the timing TE, transient response at switching between the four operating point reference frequencies of the output FOUT of the microwave oscillator 31 and at switching of the feedback path is avoided, and thus a stable state is maintained.

The switching between the four operating point reference frequencies F10, F20, F30, and F40 is digital switching of an oscillation frequency so that at least milliseconds or more of response time is required due to the setting time of digital information on the interface of the microwave oscillator 31 and stabilization time of oscillation frequency whereas a following range is arbitrary. On the other hand, the frequency modulation control by the microwave modulation input FMEX based on the output G12 of the difference detection/integration part 55a or the output G34 of the difference detection/integration part 55b is performed based on analog input, so that high-speed response of about microseconds can be achieved, whereas a following range is limited to, for example, about ±10 MHz by the specification of the microwave oscillator 31. Thus, by using the digital switching between the four operating point reference frequencies F10, F20, F30, and F40 utilizing the fluorescence image signal SIGNAL from the detection part 40 and analog FMEX input from the detection part 52 for feedback at the same time, a stable image signal can be measured always at an optimum operating point.

The physical state measurement apparatus according to the present invention uses the feedback part 50 to feedback-control the microwave oscillator in the manner as described above, so that even when, for example, the resolution of the detection part is enhanced to weaken the fluorescence image signal SIGNAL, the influence of disturbance noise during exposure can be removed, enabling stable measurement of the physical state.

Figure 7:
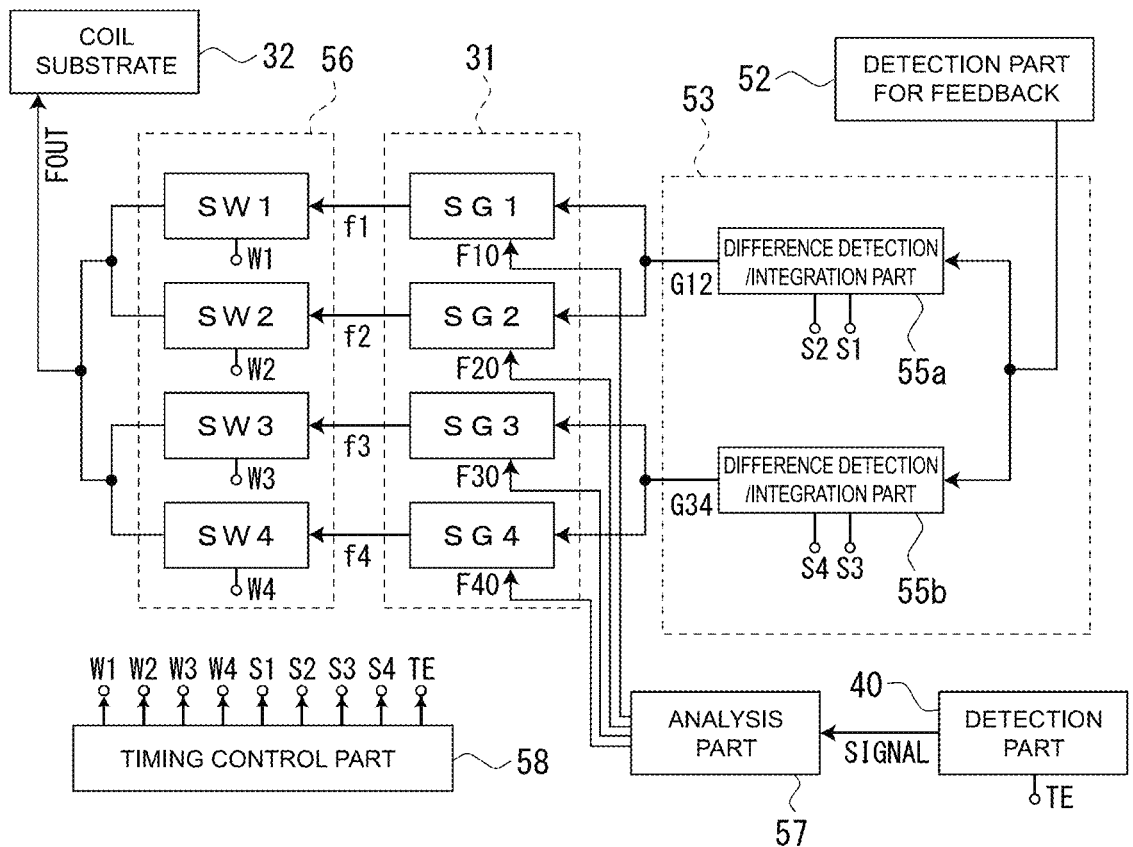
FIG. 7 is a schematic block diagram for explaining another specific example of the feedback part of the physical state measurement apparatus according to the present invention.

Although one microwave oscillator 31 of the microwave application part 30 is provided in the example illustrated in FIG. 4, the present invention is not limited to this. That is, for each operating point, a microwave oscillator with a frequency corresponding thereto may be provided. FIG. 7 is a schematic block diagram for explaining another specific example of the feedback part of the physical state measurement apparatus according to the present invention. In the drawing, the same reference numerals as those in FIG. 4 denote the same parts. In the illustrated example, the microwave application part has, for respective operating points f1, f2 and operating points f3, and f4, microwave oscillators 31 (SG1 to SG4) with frequencies corresponding thereto. It is constituted that the outputs of each of the difference detection/integration parts 55a and 55b are divided into two, which are input to frequency modulation inputs of the microwave oscillators SG1 and SG2, and the microwave oscillators SG3 and SG4, respectively. An output frequency f1 of the microwave oscillator SG1 is set with an operating point reference frequency F10 by the analysis part 57 as follows:

$$f1 = F10 + \alpha \cdot G12$$

where α is a proportional constant. Similarly, output frequencies f2, f3, and f4 of the microwave oscillators SG2, SG3, and SG4 are set with operating point reference frequencies F20, F30, and F40 by the analysis part 57 as follows:

$$f2 = F20 + \alpha \cdot G12$$

$$f3 = F30 + \alpha \cdot G34$$

$$f4 = F40 + \alpha \cdot G34.$$

Figure 8:
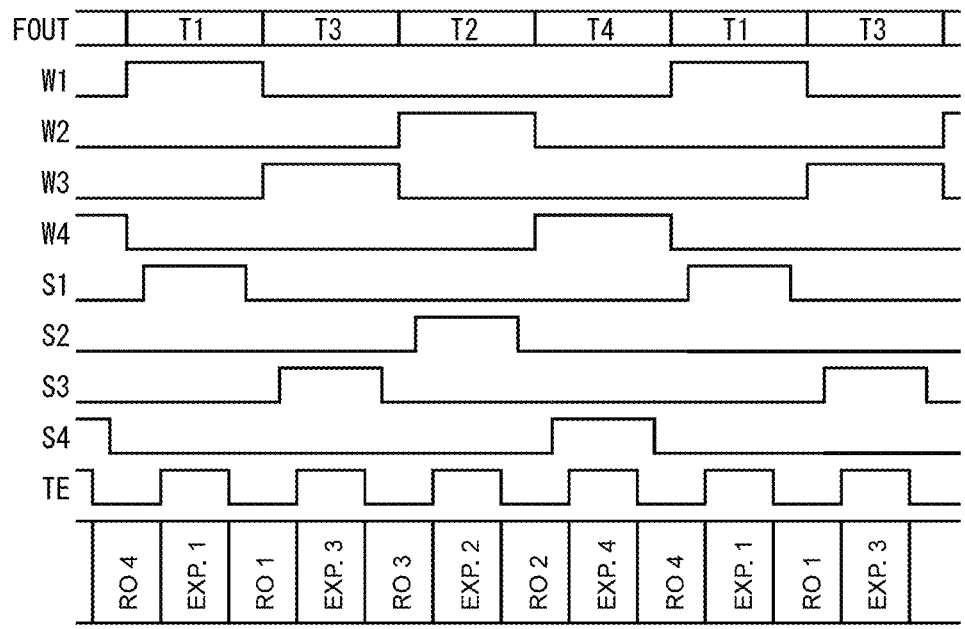
FIG. 8 is an operation timing chart of the feedback part illustrated in FIG. 7 of the physical state measurement apparatus according to the present invention.

FIG. 8 is an operation timing chart of the feedback part of the physical state measurement apparatus according to the present invention illustrated in FIG. 7. In this chart, W1 to W4 are on/off timings of the switches SW1 to SW4, respectively. At the timing S1, a feedback path of microwave oscillator SG1→switch SW1→coil substrate 32→solid material 51 for feedback→detection part 52 for feedback→difference detection/integration part 55a→microwave oscillator SG1 is closed, and the difference detection/integration part 55a operates such that the difference in fluorescence intensity between the operating points f1 and f2 becomes zero. Similarly, also at the timing S2, the difference detection/integration part 55a operates such that the difference in fluorescence intensity between the operating points f1 and f2 becomes zero. At the timing S3, a feedback path of microwave oscillator SG3→switch SW3→coil substrate 32→solid material 51 for feedback→detection part 52 for feedback→difference detection/integration part 55b→microwave oscillator SG3 is closed, and the difference detection/integration part 55b operates such that the difference in fluorescence intensity between the operating points f3 and f4 becomes zero. Similarly, also at the timing S4, the difference detection/integration part 55b operates such that the difference in fluorescence intensity between the operating points f3 and f4 becomes zero.

When one microwave oscillator is used to perform the oscillation frequency modulation for each operating point, a time of about milliseconds is required as a transient response time until microwave frequency is stabilized. That is, as described above, as illustrated in FIG. 6 which is the operation timing chart of the feedback part illustrated in FIG. 4, exposure is performed at the timing TE within the timing T1 of the output FOUT, that is, after a predetermined time delay so as to ensure a margin time for stabilizing the microwave frequency. On the other hand, in the configuration of the feedback part illustrated in FIG. 7, this margin time can be reduced. Therefore, it can lead to an increase in the exposure time or an increase in the repetition frequency of the timings T1 to T4 of the output FOUT within a followable range of the detection part 40 to ensure a longer exposure time within a certain period of time, whereby sensitivity can be increased.

Figure 9:
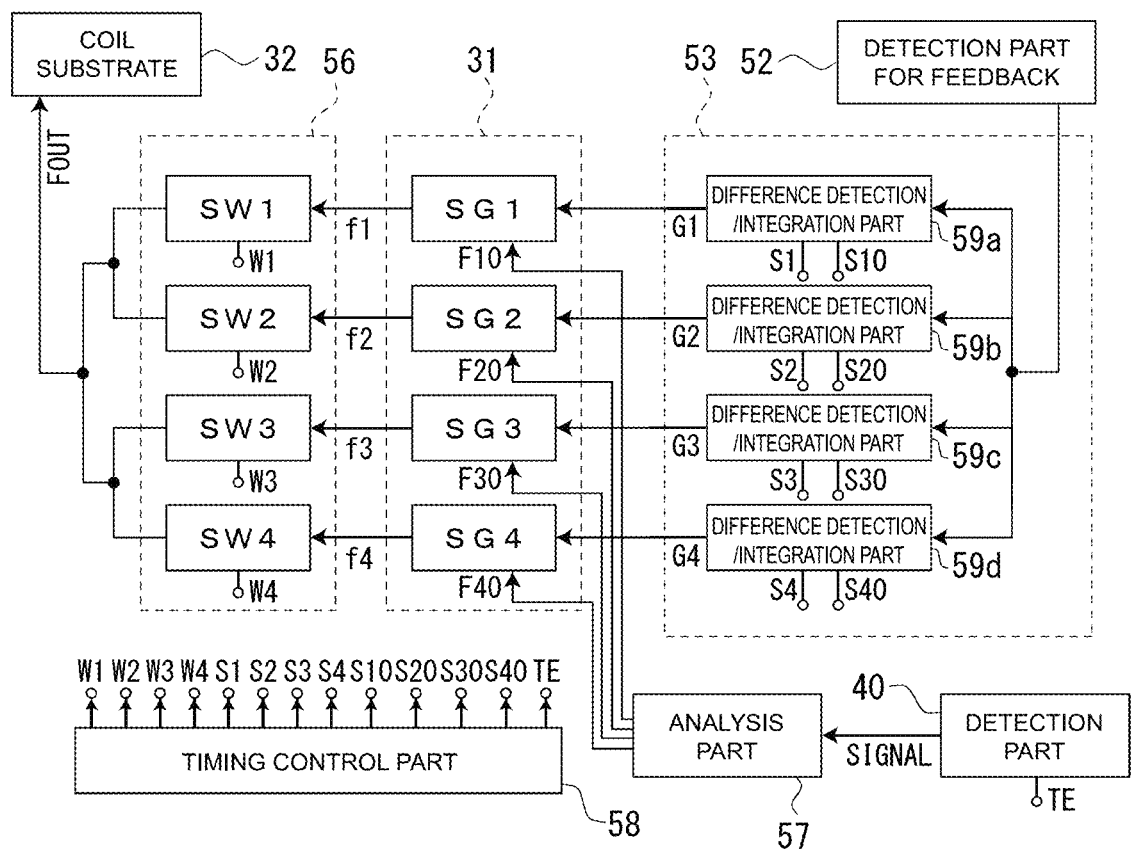
FIG. 9 is a schematic block diagram for explaining still another specific example of the feedback part of the physical state measurement apparatus according to the present invention.

Although the two difference detection/integration parts are provided for two resonance frequencies in the above example, four difference detection/integration parts may be provided for four operating points. FIG. 9 is a schematic block diagram for explaining still another specific example of the feedback part of the physical state measurement apparatus according to the present invention. In the drawing, the same reference numerals as those in FIG. 7 denote the same parts. In the illustrated example, difference detection/integration parts 59a, 59b, 59c, and 59d are provided for the respective operating points f1, f2, f3, and f4. Unlike the feedback part illustrated in FIGS. 4 and 7, the difference detection/integration part 59a is not configured to detect and integrate a difference in the fluorescence signal between the operating points f1 and f2 but to detect a difference in the fluorescence signal between one operating point and a predetermined reference. For example, the difference detection/integration part 59a may detect a difference between the fluorescence signal at the operating point f1 and that in a state where the microwave is OFF. Similarly, the difference detection/integration part 59b may detect a difference between the fluorescence signal at the operating point f2 and that in a state where the microwave is OFF, the difference detection/integration part 59c may detect a difference between the fluorescence signal at the operating point f3 and that in a state where the microwave is OFF, and the difference detection/integration part 59d may detect a difference between the fluorescence signal at the operating point f4 and that in a state where the microwave is OFF.

Figure 10:
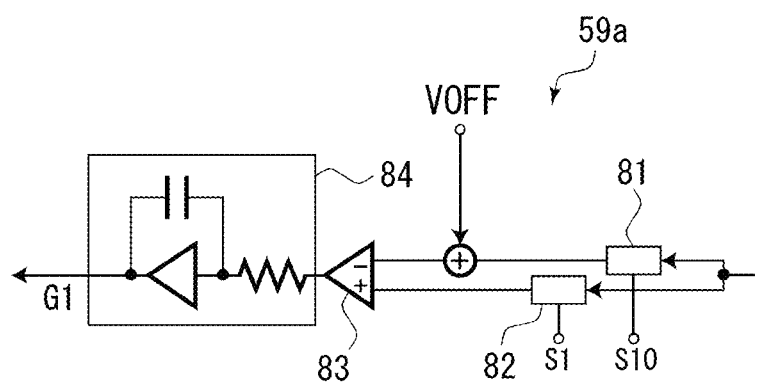
FIG. 10 is a schematic block diagram for explaining a specific example of the difference detection/integration part of the feedback part illustrated in FIG. 9 of the physical state measurement apparatus according to the present invention.

FIG. 10 is a schematic block diagram for explaining a specific example of the difference detection/integration part of the feedback part illustrated in FIG. 9 of the physical state measurement apparatus according to the present invention. The difference detection/integration parts 59a to 59d have basically the same configuration, so only the difference detection/integration part 59a is illustrated in FIG. 10. As illustrated, the difference detection/integration part 59a includes sample/hold circuits 81 and 82, a differential amplifier 83, and an integrator 84. The sample/hold circuits 81 and 82 sample and hold the amplitude of the operating point f1 and the amplitude in a state where the microwave is OFF at predetermined timings (S1, S10). The differential amplifier 83 inputs thereto the amplitudes, detects a difference therebetween, and outputs the detection result to the integrator 84. The output of the sample/hold circuit 81 includes an offset voltage VOFF added thereto. That is, a predetermined reference voltage is reached in the microwave OFF state. The integrator 84 outputs an output G1.

Referring back to FIG. 9, the frequency of the operating point f1 by the microwave oscillator SG1 is controlled based on the difference input from the difference detection/integration part 59a such that the output G1 of the difference detection/integration part 59a becomes zero. Similarly, the frequencies of the respective operating points f2, f3, and f4 by the microwave oscillators SG2, SG3, and SG4 are controlled based on the differences input from the difference detection/integration parts 59b, 59c, and 59d such that the outputs G2, G3, and G4 of the difference detection/integration parts 59b, 59c, and 59d become zero. With such control, the same amplitude is achieved at the operating points f1, f2, f3, and f4. This can remove the influence of disturbance noise during exposure, enabling stable measurement of the physical state.

Figure 11:
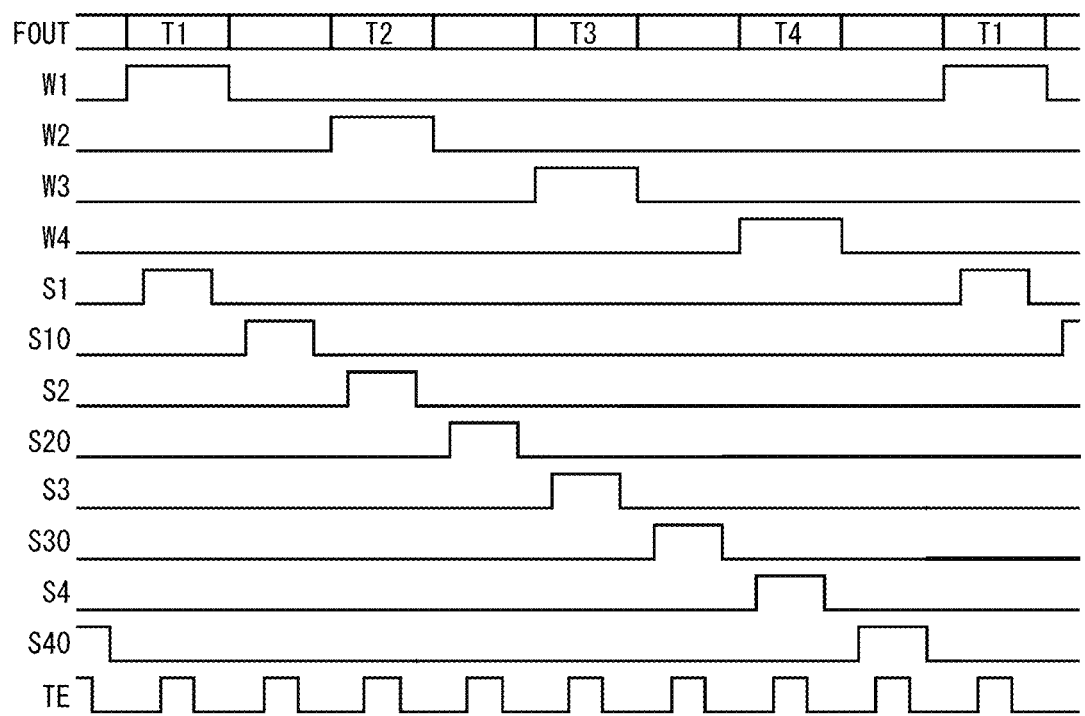
FIG. 11 is an operation timing chart of the feedback part illustrated in FIG. 9 of the physical state measurement apparatus according to the present invention.

FIG. 11 is an operation timing chart of the feedback part illustrated in FIG. 9. In this chart, S10 to S40 are operation timings of the sample/hold circuits 81 of the respective difference detection/integration parts 59a to 59d, and S1 to S4 are operation timings of the sample/hold circuits 82 of the respective difference detection/integration parts 59a to 59d. Further, W1 to W4 are on/off timings of the switches SW1 to SW4, respectively. That is, in this example, the operating points f1 and f2 of the resonance frequency R1 and the operating points f3 and f4 of the resonance frequency R2 are sequentially switched. The timing S1 of the sample/hold circuit 82 is set within the timing T1 of the output FOUT. The timing S10 is set within a timing (between T1 and T2) at which the output FOUT is in an OFF state. In the detection part 40, exposure is performed at the timing TE within each of the timings S1 to S4.

When the microwave oscillators are provided corresponding to the respective frequencies of the plurality of operating points, it is possible to increase the response speed of the microwave oscillator as compared to when one microwave oscillator is used to perform frequency modulation for each operating point. Further, it is possible to optionally set a microwave irradiation time for each operating point. This facilitates exposure time control of the detection part 40, which is suitable for magnetic imaging.

Figure 12:
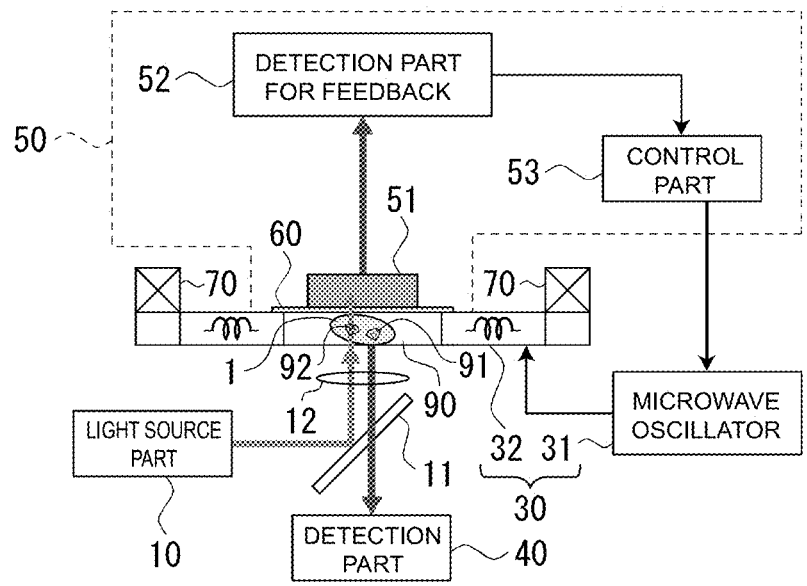
FIG. 12 is a schematic block diagram for explaining an example in which a superfine solid material is used as the main solid material for the physical state measurement apparatus according to the present invention.

The following describes an example in which a superfine solid material is used as the main solid material for the physical state measurement apparatus according to the present invention. FIG. 12 is a schematic block diagram for explaining an example in which a superfine solid material is used as the main solid material for the physical state measurement apparatus according to the present invention. In the drawing, the same reference numerals as those in FIG. 1 denote the same parts. The example illustrated in FIG. 12 corresponds to the physical state measurement apparatus illustrated in FIG. 1. In the example of FIG. 1, the main solid material 20 is, for example, a diamond substrate, between which and the solid material 51 for feedback the object 1 to be measured is disposed, and the physical state of the object 1 to be measured is detected. On the other hand, in the physical state measurement apparatus illustrated in FIG. 12, superfine solid materials 91 and 92 are used as the main solid material. The superfine solid materials 91 and 92 are made of, for example, nanosized particulate diamond (nanodiamond). The object 1 to be measured is, for example, a cell and is disposed on a medium 90. The medium 90 is filled in a space between the coil substrates 32 of the microwave application part 30. The superfine solid materials 91 and 92 are made to adhere to the object 1 to be measured, whereby the superfine solid materials 91 and 92 are disposed in the vicinity of the object 1 to be measured. As in the above example, the main solid material constituted by the superfine solid materials 91 and 92 may be made of, for example, silicon carbide, gallium nitride, boron nitride, or the like, in addition to diamond.

When the object to be measured is a cell, using such a superfine solid material as the main solid material allows the superfine solid material to adhere to the cell itself. That is, the main solid material can be disposed closer to the object to be measured, allowing temperature or magnetic field in the cell to be measured more strictly.

The electronic spin resonance spectrum generated by nanodiamond is generally weak, so that fluorescence is buried in shot noise. To reduce shot noise, fluorescence is integrated for a predetermined period of time. When disturbance noise of a magnetic field of a certain magnitude or more is applied during the integration, the integration becomes invalid. However, according to the physical state measurement apparatus of the present invention, using the feedback part as described above makes it possible to eliminate the influence of disturbance noise during exposure, so that it is possible to achieve measurement without being affected by disturbance noise even with weak electronic spin resonance spectrum generated by nanodiamond.

Here, the NV axis (crystal plane orientation) of nanodiamond which is the superfine solid material will be described. In a diamond substrate as illustrated in FIG. 1, the orientations of the NV axis thereof are arranged in a direction perpendicular to a (111) plane. On the other hand, in the case of the superfine solid material, the NV axis is generally not oriented in one direction, but in four directions. When disturbance noise is corrected in the physical state measurement apparatus according to the present invention using the superfine solid material, an omnidirectional vector magnetic field needs to be measured. Thus, also for the solid material for feedback, a crystal plane orientation in four directions is used corresponding to a superfine solid material having four directions so as to have a crystal plane orientation corresponding to the main solid material.

Figure 13:
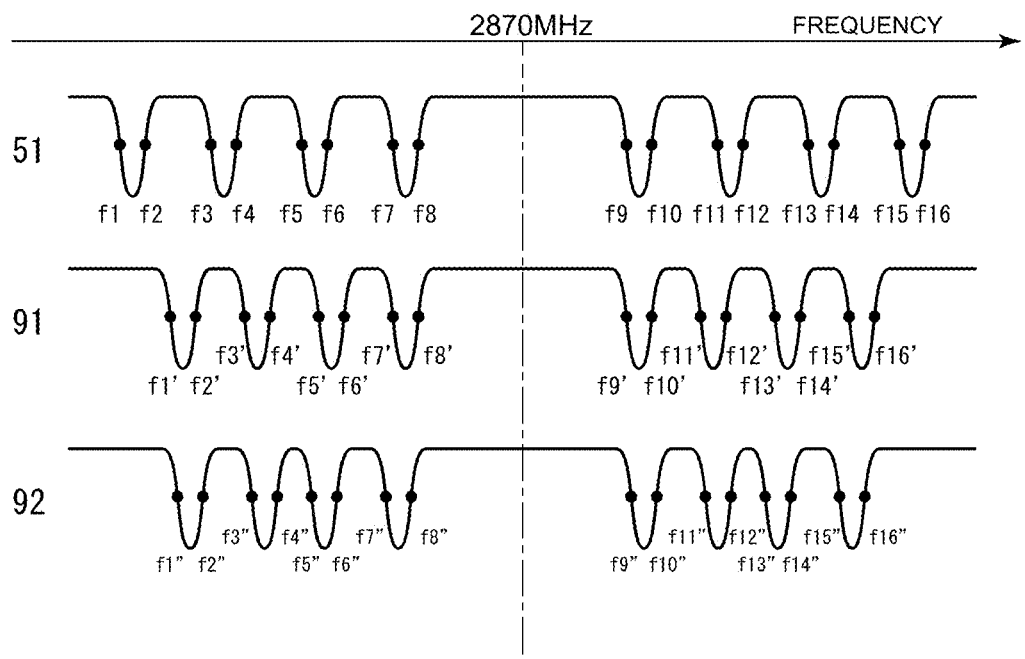
FIG. 13 illustrates an example of the electronic spin resonance spectrum obtained by the solid material for feedback of the feedback part when the superfine solid material is used as the main solid material for the physical state measurement apparatus according to the present invention.

FIG. 13 illustrates an example of the electronic spin resonance spectrum obtained by the solid material for feedback of the feedback part when the superfine solid material is used as the main solid material for the physical state measurement apparatus according to the present invention. In this example, nanodiamond is used as the superfine solid material. The solid material 51 for feedback is a diamond substrate and has a four-orientation NV axis. In this case, four sets of lower portions of the spectrum amplitude exist as illustrated with the lower portions on the low-frequency side and high-frequency side symmetrically centered around 2870 MHz being one set. However, depending on the direction of a static magnetic field to be applied, spectrum may be degenerated and then the number of sets of the lower portions could be reduced to three, two, or one. When a plurality of superfine solid materials 91 and 92 made of nanodiamond exist, the crystal axes thereof are generally oriented to different directions. Thus, even when the same static magnetic field is applied, the electronic spin resonance spectrums obtained from the superfine solid materials 91 and 92 differ from each other as illustrated. The resonance frequencies of one set of the lower portion of the spectrum amplitudes and the interval therebetween change depending on a magnetic field or temperature as in the case where the diamond substrate is used. By measuring thus change, the magnetic field and temperature of the object 1 to be measured can be grasped. As the method itself of measuring the magnetic field and temperature using the lowering portion of the electronic spin resonance spectrum, the conventional ones or those to be developed in the future may all be applicable.

The following specifically describes the method of measuring a change in a magnetic field using the electronic spin resonance spectrum as illustrated in FIG. 13. As compared to the ultrafine solid material, the solid material 51 for feedback has a high-concentration impurity atom-vacancy center and has a strong fluorescence intensity. This allows the electronic spin resonance spectrum to be clearly measured even with a short-time integration.

As in the case of using the diamond substrate, the two operating points on the low-frequency side and high-frequency side of each lowering portion of the spectrum amplitude are determined also for the electronic spin resonance spectrum illustrated in FIG. 13. Specifically, 16 frequencies of f1 to f16 are determined as the operating points for eight lowering portions, followed by measurement of fluorescence intensity at each determined frequency. The operating point may be determined by obtaining, for example, the maximum inclination point of the spectrum amplitude or obtaining positive and negative positions at which the fluorescence intensity at a specific percentage of the depth of the lowering portion is obtained.

The four NV axes of the solid material 51 for feedback corresponding to the four sets of the lowering portions are assumed to be first to four NV axes in the order from the outside. For the first NV axis, a change in fluorescence intensity at f1 is assumed to be $\Delta F1$, a change in fluorescence intensity at f2 is assumed to be $\Delta F2$, a change in fluorescence intensity at f15 is assumed to be $\Delta F15$, and a change in fluorescence intensity at f16 is assumed to be $\Delta F16$. In this case, assuming that a change in magnetic field intensity due to disturbance noise in the orientation of the first NV axis is $\Delta B1$, $\Delta B1$ can be represented by the following expression:

$$\Delta B1 = (\Delta F16/\text{slope}16 - \Delta F15/\text{slope}15 - \Delta F2/\text{slope}2 + \Delta F1/\text{slope}1)/4/\gamma,$$

where slope1 to slope16 is the inclination of the electronic spin resonance spectrum at f1=16, and $\gamma$ is a magnetic rotation ratio. Similarly, for the second to fourth NV axes, changes $\Delta B2$ to $\Delta B4$ in the respective magnetic field intensities can be calculated using the operating points f3 to f14.

The frequencies of the operating points f1' to f16' of the superfine solid material 91 made of nanodiamond may be set in the same manner as the initial setting for the case where the diamond substrate is used. That is, the microwave application part is used to perform sweeping over a sufficiently wide frequency range, and amplitudes of the lowering portions are equalized after measurement of the electronic spin resonance spectrum, and whereby the operating points f1' to f16' are determined and stored as the initial state. In this state, the orientations of the four NV axes of the superfine solid material 91 are determined.

Since a diamond substrate, which has crystal whose crystal plane orientation is known and which is fixed to a measurement system, is used as the solid material 51 for feedback, the orientations of the four NV axes are known as a matter of course. Further, the changes $\Delta B1$ to $\Delta B4$ in the magnetic field intensities due to disturbance noise in the orientation of the NV axis of the solid material 51 for feedback and the orientations of the four NV axes of the superfine solid material 91 are also already known. Thus, the influence of disturbance noise on the lowering portion of the NV axis is known as a correction amount for the frequency of each of the operating points f1' to f16'. That is, the feedback part 50 may use a difference in amplitude between the two operating points on the low-frequency side and high-frequency side of the lowering portion of the spectrum amplitude as a correction amount for each of the operating points f1' to f16' after correction and perform feedback control such that the difference becomes zero.

Similarly, for the superfine solid material 92, the influence of disturbance noise on the lowering portion of the NV axis is known as a correction amount for the frequency of each of the operating points f1" to f16".

The following specifically describes an advantage of correcting the position of the lowering portion of the spectrum amplitude with respect to the disturbance noise magnetic field when the superfine solid material like nanodiamond is used as the main solid material.

Measurement of a magnetic field from fluorescence generated from the superfine solid material and the solid material for feedback is subjected to:

Noise 1 which exists inside excitation light itself for generating fluorescence; and Noise 2 which is shot noise of fluorescence itself. Further, the superfine solid material and the solid material for feedback themselves are subjected to:

Noise 3 which is disturbance noise.

The electronic spin resonance spectrum illustrated in FIG. 13 has microwave frequency dependency of fluorescence intensity, so that it fluctuates in the vertical direction (fluorescence intensity direction) due to Noise 1 and Noise 2 and fluctuates in the horizontal direction (frequency axis direction) due to Noise 3. Noise 1 can be removed by subtraction from a final measurement result of an independent measurement operation. However, Noise 2 and Noise 3 become a problem. More specifically, interaction between Noise 2 and Noise 3 becomes a problem.

Fluorescence generated from the superfine solid material is so weak that it can be buried in Noise 2. Noise 2 generally becomes random Gaussian noise and is thus converged to a fixed value by long-time integration. However, as has been described so far, when Noise 3 above a certain level is applied during integration, the integration becomes invalid. However, even in the presence of Noise 3, the operating point can be identified by long time integration when the operating point does not fall outside the slope of the lowering portion of the electronic spin resonance spectrum. This is because, in general, within a sufficiently long period of time, the average value of Noise 3 approaches zero in the absence of drift. However, when Noise 3 is so large as to fall outside the slope (more precisely, the linear area of the slope), integration is performed in a state where the distribution of Noise 2 to be added to fluorescence intensity while Noise 3 falls outside the slope has an erroneous center value.

However, in the physical state measurement apparatus according to the present invention, the feedback part performs feedback control so as to prevent Noise 3 from falling outside the linear area of the slope, so that if Noise 3 is large, the physical state can be measured stably even with long-time integration. Further, when a detected change in the operating point falls within a predetermined range, correction processing may be applied as needed to a measurement result after physical state measurement, while when the change exceeds the predetermined range, the feedback control may be performed.

Figure 14:
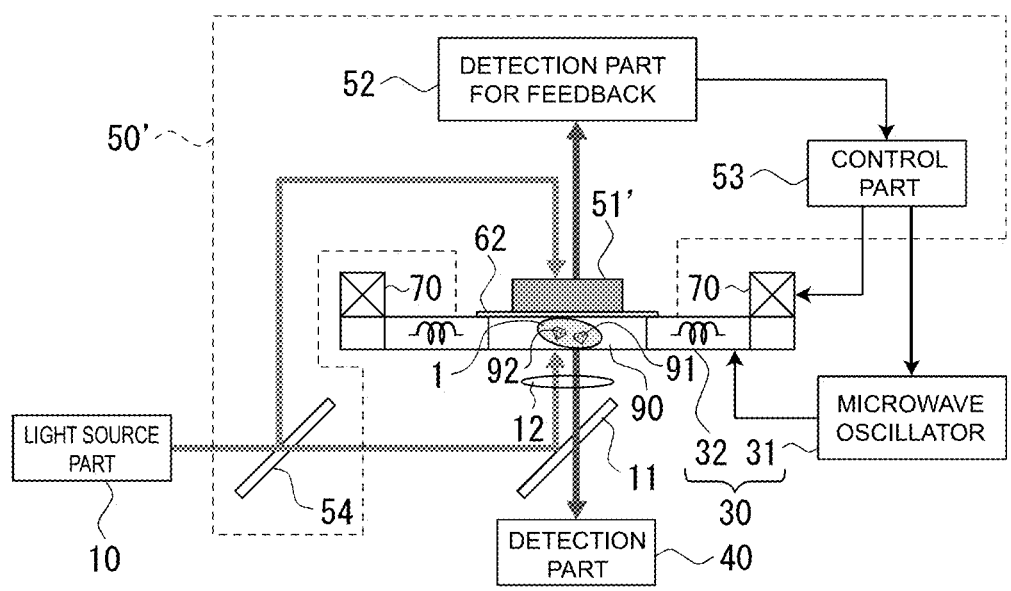
FIG. 14 is a schematic block diagram for explaining another example in which the superfine solid material is used as the main solid material for the physical state measurement apparatus according to the present invention.

The following describes another example in which the superfine solid material is used as the main solid material for the physical state measurement apparatus according to the present invention. FIG. 14 is a schematic block diagram for explaining another example in which the superfine solid material is used as the main solid material for the physical state measurement apparatus according to the present invention. In the drawing, the same reference numerals as those in FIG. 2 denote the same parts. The example illustrated in FIG. 14 corresponds to the physical state measurement apparatus illustrated in FIG. 2. In the example of FIG. 2, the main solid material 20 is, for example, a diamond substrate, between which and the solid material 51 for feedback the object 1 to be measured is disposed, and the physical state of the object 1 to be measured is detected. On the other hand, in the physical state measurement apparatus illustrated in FIG. 14, the superfine solid materials 91 and 92 are used as the main solid material as in the example illustrated in FIG. 12. The superfine solid materials 91 and 92 are made of, for example, nanosized particulate diamond (nanodiamond). As in the example illustrated in FIG. 12, the object 1 to be measured is, for example, a cell and is disposed on the medium 90. The medium 90 is filled in a space between the coil substrates 32 of the microwave application part 30. The superfine solid materials 91 and 92 are made to adhere to the object 1 to be measured, whereby the superfine solid materials 91 and 92 are disposed in the vicinity of the object 1 to be measured. As in the above example, the main solid material constituted by the superfine solid materials 91 and 92 may be made of, for example, silicon carbide, gallium nitride, boron nitride, or the like, in addition to diamond.

As in the example illustrated in FIG. 2, the feedback part 50' has the dividing part 54 in the example illustrated in FIG. 14. The dividing part 54 divides excitation light from the light source part 10. The dividing part 54, which is, for example, a half mirror or the like, is configured to divide the excitation light into excitation light directed to the superfine solid materials 91 and 92 and excitation light directed to the solid material 51' for feedback. This can enhance the intensity of the excitation light directed to the solid material 51' for feedback. This also enhances the intensity of fluorescence generated upon excitation by such strong excitation light, enabling more stable feedback control.

Since the object 1 to be measured may be broken due to the strong excitation light leaking from the solid material 51' for feedback to the object 1 to be measured, the second filter part 62 is provided in this illustrated example. The second filter part 62 blocks excitation light leaking from the solid material 51' for feedback to the object 1 to be measured. The second filter part 62 may be a short path filter disposed between the superfine solid materials 91 and 92 and the solid material 51' for feedback and configured to block excitation light (green light) leaking from the solid material 51' for feedback to the object 1 to be measured and fluorescence (red light) generated from the solid material 51' for feedback. This can prevent the object 1 to be measured from being broken by the excitation light and fluorescence from the solid material 51' for feedback. Thus, it is possible to irradiate the solid material 51' for feedback with sufficiently strong excitation light and to further reduce shot noise of the solid material 51' for feedback. Further, disturbance noise detection in the solid material 51' for feedback can be performed with higher sensitivity.

In this example as well, as in the example illustrated in FIG. 2, by using, for example, blue light having a wavelength shorter than the cutoff wavelength of the second filter part 62 to illuminate the object 1 to be measured, it is possible to monitor in real time the bright-field image of the object 1 to be measured.

Figures 15A, 15B, 15C:
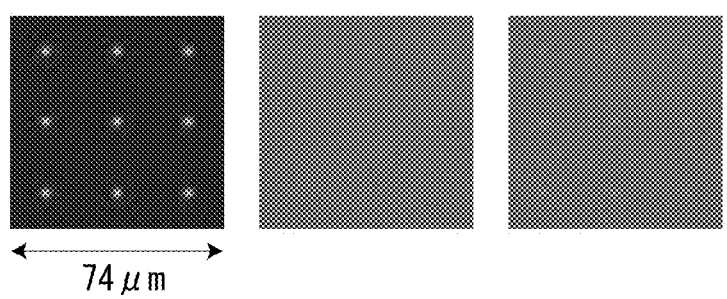
FIG. 15 is simulation results of a magnetic image of magnetic particles measured by the physical state measurement apparatus according to the present invention.

FIG. 15 is simulation results of a magnetic image of magnetic particles measured by the physical state measurement apparatus according to the present invention. FIG. 15A illustrates a magnetic image in the absence of both shot noise and disturbance noise, FIG. 15B illustrates a magnetic image in the presence of both shot noise and disturbance noise, and FIG. 15C is a magnetic image from which disturbance noise has been removed by the present invention. The drawings are the simulation images obtained by the apparatus illustrated in FIG. 1 when superparamagnetic particles each having a diameter of 1 m is observed using a diamond substrate in which a main solid material has an NV layer having a thickness of 1 m. Total exposure time was set to 10 seconds, and disturbance noise was actually measured in a laboratory.

As illustrated, in FIG. 15B, the magnetic particles are hardly distinguished, whereas in FIG. 15C, disturbance noise is removed, and the magnetic particles can be distinguished. Thus, with the physical state measurement apparatus of the present invention, it is possible to measure the physical state stably without being affected by disturbance noise even with long time integration.

The physical state measurement apparatus according to the present invention is not limited to the above-described illustrated examples and may be variously modified without departing from the spirit and scope of the invention.

REFERENCE SYMBOLS LIST

1: Object to be measured
10: Light source part
11: Dichroic mirror
12: Objective lens
20: Main solid material
30: Microwave application part
31: Microwave oscillator
32: Coil substrate
40: Detection part
50: Feedback part
51: Solid material for feedback
52: Detection part for feedback
53: Control part
54: Dividing part
55a, 55b: Difference detection/integration part
56a, 56b: Switch
57: Analysis part
58: Timing control part
59a, 59b, 59c, 59d: Difference detection/integration part
60: Filter part
61: First filter part
62: Second filter part
70: Static magnetic field application part
81, 82: Sample/hold circuit
83: Differential amplifier
84: Integrator
90: Medium
91, 92: Superfine solid material

The invention claimed is:

1. A physical state measurement apparatus using magnetic resonance, comprising:
a light source part emitting excitation light;
a main solid material disposed near an object to be measured and having electrons excited by the excitation light from the light source part;
a microwave application part applying microwaves to the main solid material so as to control a state of the electrons of the main solid material;
a detection part detecting an excited state of the electrons based on excitation by the excitation light in the main solid material to detect a physical state of the object to be measured;
a feedback part having a solid material for feedback and a control part, the solid material for feedback being disposed opposite to the main solid material, being made of the same material as the main solid material, having a crystal plane orientation corresponding to the main solid material, and having electrons excited by the excitation light from the light source part, the control part detecting a change in at least one of two operating points on a low-frequency side and a high-frequency side of a lowering portion of a spectrum amplitude centered on a resonance frequency of an electron spin resonance spectrum based on excitation of the electrons by the excitation light in the solid material for feedback generated by microwaves from the microwave application part and feedback-controlling the microwave application part such that the change becomes zero; and a static magnetic field application part applying a static magnetic field to the main solid material and the solid material for feedback so as to make the electronic spin resonance spectrum have at least two resonance frequencies.

2. The physical state measurement apparatus according to claim 1, in which the solid material for feedback in the feedback part has electrons excited by excitation light emitted from the light source part and leaking through the main solid material.

3. The physical state measurement apparatus according to claim 2, further comprising a filter part that passes the excitation light leaking to the solid material for feedback through the main solid material and blocks fluorescence from the solid material for feedback to the main solid material generated upon excitation by the excitation light in the solid material for feedback.

4. The physical state measurement apparatus according to claim 1, in which
the feedback part has a dividing part that divides the excitation light from the light source part, and
the solid material for feedback has electrons excited by the excitation light from the dividing part.

5. The physical state measurement apparatus according to claim 4, further comprising:
a first filter part that blocks excitation light leaking from the main solid material to the object to be measured and a second filter part that blocks excitation light leaking from the solid material for feedback to the object to be measured.

6. The physical state measurement apparatus according to claim 1, in which the feedback part detects a difference in amplitude between two operating points on a low-frequency side and high-frequency side of a lowering portion of a spectrum amplitude centered on a resonance frequency of an electron spin resonance spectrum based on excitation of electrons by the excitation light in the solid material for feedback and feedback-controls the microwave application part such that the difference becomes zero.

7. The physical state measurement apparatus according to claim 1, in which the feedback part detects a difference between one of two operating points on a low-frequency side and high-frequency side of a lowering portion of a spectrum amplitude centered on a resonance frequency of an electron spin resonance spectrum based on excitation of electrons by the excitation light in the solid material for feedback and a predetermined reference and feedback-controls the microwave application part such that the difference becomes zero.

8. The physical state measurement apparatus according to claim 1, in which the feedback part performs correction processing for a measurement result after physical state measurement when a detected change in at least one operating point falls within a predetermined range, while it performs feedback-control when the change exceeds a predetermined value.

9. The physical state measurement apparatus according to claim 1, in which the detection part uses fluorescence excited and generated in the main solid material to detect an excited state of electrons.

10. The physical state measurement apparatus according to claim 9, in which the feedback part detects an electron spin resonance spectrum of intensity of fluorescence excited and generated in the material for feedback.

11. The physical state measurement apparatus according to claim 1, in which the detection part has a photo diode or an image sensor.

12. The physical state measurement apparatus according to claim 1, in which the feedback part uses a photodiode to detect the electron spin resonance spectrum.

13. The physical state measurement apparatus according to claim 1, in which the detection part uses photocurrent excited and generated in the main solid material to detect an excited state of electrons.

14. The physical state measurement apparatus according to claim 13, in which the feedback part detects the electron spin resonance spectrum of photocurrent excited and generated in the solid material for feedback.

15. The physical state measurement apparatus according to claim 1, in which the feedback part uses one of at least two resonance frequencies of the electron spin resonance spectrum in the solid material for feedback.

16. The physical state measurement apparatus according to claim 1, in which the feedback part further feedback-controls the static magnetic field application part.

17. The physical state measurement apparatus according to claim 1, in which
the main solid material and the solid material for feedback each have an impurity atom-vacancy center, and
the solid material for feedback is equal to or higher than the main solid material in terms of impurity atom-vacancy center density per unit volume, larger than the main solid material in terms of the thickness of a layer including the impurity atom-vacancy center, and larger than main solid material in terms of the total amount of the impurity atom-vacancy centers.

18. The physical state measurement apparatus according to claim 17, in which the main solid material and the solid material for feedback are disposed parallel in the crystal plane orientation to each other so that the orientations of all the impurity atom-vacancy axes that can exist are the same.

19. The physical state measurement apparatus according to claim 1, in which
the main solid material and the solid material for feedback are each made of either of diamond, silicon carbide, gallium nitride, or boron nitride, and
the main solid material and the solid material for feedback have the same crystal plane orientation.

20. The physical state measurement apparatus according to claim 1, in which
the main solid material is a superfine solid material made of either of diamond, silicon carbide, gallium nitride, or boron nitride, and
the solid material for feedback has a crystal plane orientation in four directions.

21. A physical state measurement apparatus using magnetic resonance, comprising:
a light source part emitting excitation light;
a main solid material disposed near an object to be measured and having electrons excited by the excitation light from the light source part;

a microwave application part applying microwaves to the main solid material so as to control a state of the electrons of the main solid material;
a detection part detecting an excited state of the electrons based on excitation by the excitation light in the main solid material to detect a physical state of the object to be measured;
a feedback part having a solid material for feedback and a control part, the solid material for feedback being disposed opposite to the main solid material, being made of the same material as the main solid material, having a crystal plane orientation corresponding to the main solid material, and having electrons excited by the excitation light from the light source part, the control part detecting a change in at least one of two operating points on a low-frequency side and a high-frequency side of a lowering portion of a spectrum amplitude centered on a resonance frequency of an electron spin resonance spectrum based on excitation of the electrons by the excitation light in the solid material for feedback generated by microwaves from the microwave application part and performing correction processing for a measurement result after physical state measurement; and
a static magnetic field application part applying a static magnetic field to the main solid material and the solid material for feedback so as to make the electronic spin resonance spectrum have at least two resonance frequencies.

* * * * *